United States Patent [19]

Mehuys et al.

[11] Patent Number: 5,159,604
[45] Date of Patent: Oct. 27, 1992

[54] ANTIGUIDED SEMICONDUCTOR LASER ARRAY WITH EDGE REFLECTORS

[75] Inventors: David G. Mehuys, Sunnyvale, Calif.; Amos A. Hardy, Tel Aviv, Israel; David F. Welch, San Jose, Calif.; Robert G. Waarts, Palo Alto, Calif.; Donald R. Scifres, San Jose, Calif.

[73] Assignee: Spectra Diode Laboratories, Inc., San Jose, Calif.

[21] Appl. No.: 737,463

[22] Filed: Jul. 29, 1991

[51] Int. Cl.$^5$ .............................................. H01S 3/19
[52] U.S. Cl. ...................................................... 372/50
[58] Field of Search ............................. 372/44, 46, 50

[56] References Cited

U.S. PATENT DOCUMENTS

| | | | |
|---|---|---|---|
| 4,255,717 | 3/1981 | Scifres et al. | 372/50 |
| 4,534,033 | 8/1985 | Nishizawa et al. | 372/50 |
| 4,594,719 | 6/1986 | Ackley | 372/50 |
| 4,624,000 | 11/1986 | Streifer et al. | 372/45 |
| 4,692,925 | 9/1987 | Botez | 372/46 |
| 4,692,926 | 9/1987 | Marschall et al. | 372/46 |
| 4,715,672 | 12/1987 | Duguay et al. | 350/96.12 |
| 4,718,069 | 1/1988 | Streifer et al. | 372/50 |
| 4,751,711 | 6/1988 | Welch et al. | 372/50 |
| 4,860,298 | 8/1989 | Botez et al. | 372/45 |
| 4,972,427 | 11/1990 | Streifer et al. | 372/92 |
| 4,985,897 | 1/1991 | Botez et al. | 372/50 |

OTHER PUBLICATIONS

D. E. Ackley et al., "High-power Leak-mode Multiple-stripe Laser," *Appl. Phys. Lett.* 39(1), Jul. 1, 1981, pp. 27-29.
W. Streifer et al., "Single-Lobe Phased-Array Diode Lasers," *Electronics Letters.*, vol. 21, No. 3, Jan. 31, 1985, pp. 118-120.
D. Botez et al., "Phase-Locked Arrays of Semiconductor Diode Lasers," *IEEE Circuits and Devices*, Jan. 1986, pp. 8-17.

*Primary Examiner*—John D. Lee
*Assistant Examiner*—Robert E. Wise
*Attorney, Agent, or Firm*—Schneck & McHugh

[57] ABSTRACT

In a semiconductor laser array structure in which antiguided regions between high effective refractive index waveguide regions experience greater gain then the waveguide regions, structures introduced at the sides of the array, next to the edgemost waveguides and not on the array period, reflect laterally transmitted radiation back toward the center of the array. The edge reflecting structures may be waveguide regions having widths of $(m'+\frac{1}{2})$ half-wavelengths, where "m'" is zero or a positive integer, compared to array waveguides with width m, where "m" is an integer not necessarily equal to "m'". The edge reflecting structures may also be stacks of such waveguides, where the regions between the edge waveguides are of a width substantially equal to $(n'+\frac{1}{2})$ half-wavelengths, compared to antiguide element widths of n half-wavelengths. The two integers n and n' may be, but are not necessarily, equal. Alternatively, the edge reflectors can be mirrors fabricated at the side edges of the array or by disordering the active region beyond the edgemost waveguides to form a refractive index step. The mirrors should be positioned a distance substantially a/2 from the edgemost emitters, where "a" is the array period.

17 Claims, 6 Drawing Sheets

ANTIGUIDED SEMICONDUCTOR LASER ARRAY WITH EDGE REFLECTORS

DESCRIPTION

1. Technical Field

The present invention relates to monolithic integrated phased array semiconductor lasers of the type in which the optical field in regions between the high effective refractive index waveguide regions experience greater gain than the optical field within the waveguide regions, i.e. antiguide lasers.

2. Background Art

In U.S. Pat. No. 4,624,000, Streifer et al. describe a phased array semiconductor laser having multiple lasing elements, spatially disposed relative to an active region and providing optical cavities for lightwave generation and propagation under lasing conditions. The optical field of each lasing element is coupled into the optical cavities of adjacent lasing elements to provide a phase locked condition across the array. Various structures are disclosed for causing regions between the optical cavities to experience higher gain compared to the gain experienced in the optical cavities. For example, electrically insulative implant regions produce a spatial modulation in the current distribution laterally across the laser array. Alternatively, a waveguide layer adjacent to the active region may have a periodic undulation in thickness to provide a plurality of real refractive index waveguides alternating with "between" regions. The undulation produces a spatially modulated overlap of the optical field with the active region, such that the intensity profile of the propagating lightwaves in the waveguide regions is offset relative to the active region. Consequently, the filling factor, i.e. the percentage of the optical modal intensity in the active region, and thus also the local gain, will be greater in the "between" regions than in the waveguide regions.

Laser arrays, such as those described in the aforementioned Streifer patent, which have higher gain outside of the waveguides, are called "antiguide" arrays. Antiguide laser arrays have demonstrated single mode operation to moderate cw output powers, and are a promising source of high power cw coherent radiation.

In antiguide arrays, lateral transmission of optical radiation between the array elements leads to a number of possible lateral modes. The resonant antiguided lateral mode, seen in FIG. 1A, is characterized by a nearly uniform near field intensity envelope 11, very low field intensity 13 in regions of high effective refractive index, i.e. in the interelement waveguides 15, and significant lateral field penetration or "tails" 17 into the unpumped absorbing regions 19 at the sides of the array. Nonresonant modes, such as that seen in FIG. 1B, are characterized by a nonuniform near field intensity envelope 21, increased field intensity 23 in the interelement regions 15 and reduced lateral field penetration 25 into the unpumped side regions 19 of the array. The lateral tails 17 in the resonant mode give rise to increased lateral radiation losses. By comparison, the nonresonant modes normally have lower lateral radiation loss in side regions 19.

Most antiguide array designs that have been reported tailor the thickness of the high index waveguide regions in order to enhance resonant tunneling of the optical mode. As a result, the lowest threshold mode has a uniform near field. In this configuration, however, mode discrimination in favor of the resonant mode can only be maintained with the introduction of loss in the high index waveguide regions between lasing elements. This is because, in order to suppress the nonresonant modes, the interelement loss must be increased to a level where it more than compensates for the increased lateral radiation losses of the resonant mode in the unpumped side regions of the array. This requirement leads to complicated regrowth structures with tight processing tolerances and low yields. Further, the resulting laser arrays suffer from elevated thresholds due the introduced losses.

It is an object of the present invention to provide antiguided semiconductor laser array structures that have a nearly uniform near field intensity envelope for the emitted laser light, which also have lower thresholds and higher yields than previously possible.

DISCLOSURE OF THE INVENTION

The above object has been achieved by introducing, into antiguide laser arrays, structures at the sides of the arrays next to the edgemost waveguides and not spaced on the array period for reflecting back a portion of the laterally transmitted radiation of the laser array. In one embodiment, the structures are two mirror waveguide layers, one at each lateral edge of the array, where the thickness of the layers provides inphase reflection of the optical field, if their widths are $(m'+\frac{1}{2})$ lateral half-wavelengths. Here, m' is either zero or a positive integer. This is in contrast to the positive index waveguides in the body of the array, which are designed to be m lateral half-wavelengths in width to provide resonant transmission, where m is a positive integer. The reflection provided by the mirror layers reduce the lateral field penetration into the unpumped side regions, thereby reducing the radiation losses of the preferred resonant mode and lowering its threshold. In addition to lowering the device threshold, this feature improves mode discrimination against nonresonant modes. Furthermore, the reflection from a single mirror layer on each side of the array can be increased further by adding one or more additional mirror layers on each side of the array.

In another embodiment, the reflecting structures are mirrors fabricated at the side edges of an antiguide laser array. The mirrors may be fabricated by disordering the active region, and the waveguide layers above and below the active region, in regions beyond the edgemost waveguides in order to produce a higher index material at the sides of the array. The change or step up in the refractive index is chosen to prevent radiation losses of both the resonant and nonresonant modes, which have a propagation angle of about 6° with the edges of the array. The mirrors should be positioned at a distance approximately a/2 from the edgemost emitters or lasing spots, where "a" is the periodic spacing between such spots, in order to create a uniform near field pattern for the lowest threshold nonresonant mode. The uniform field reduces the effects of a nonuniform spatial gain saturation and thereby preserves mode discrimination against competing spatial modes, without the need to introduce additional losses that would increase threshold.

BEST MODE OF CARRYING OUT THE INVENTION

Figure 2:
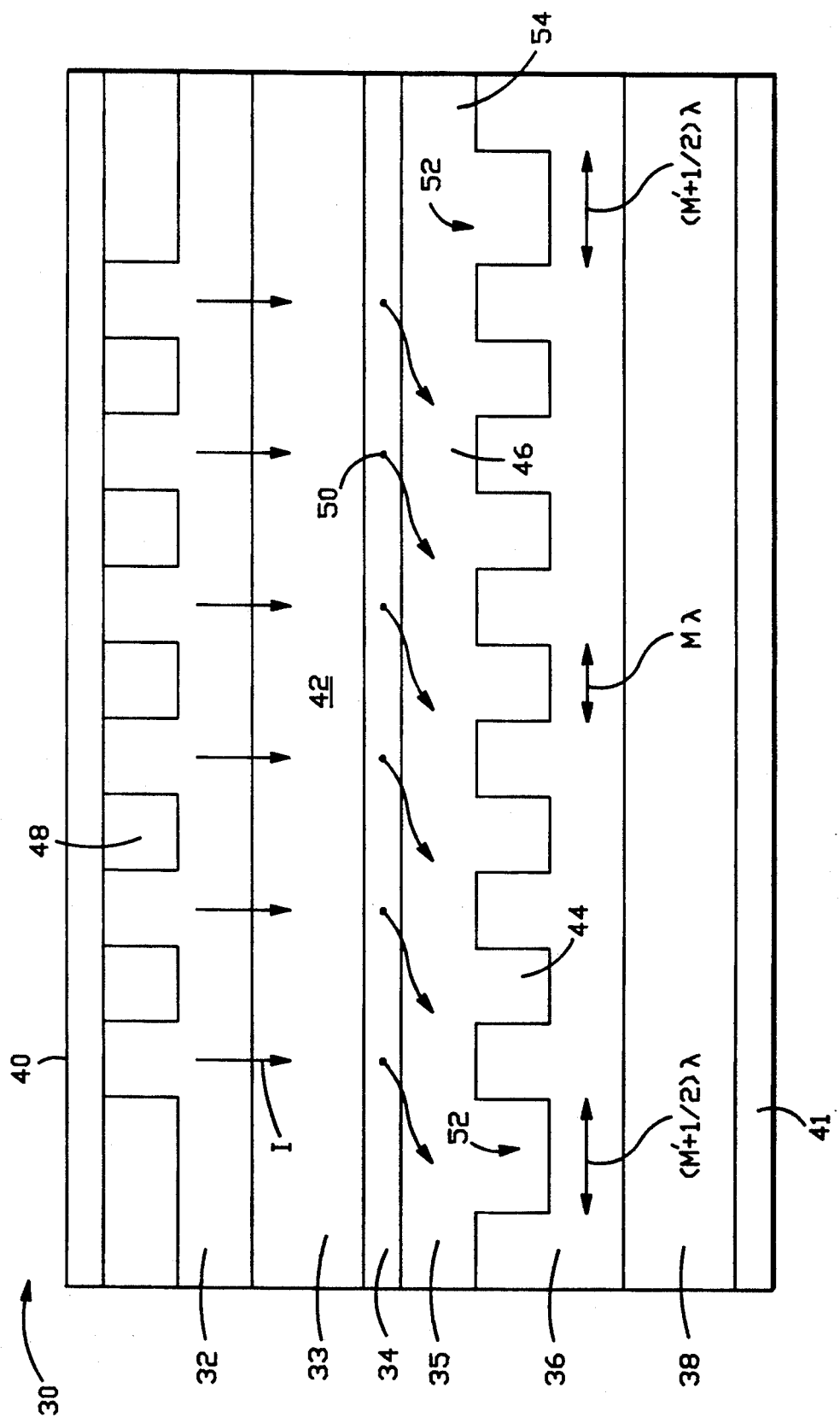
FIG. 2 is a front end view of a first antiguide array embodiment in accord with the present invention.

With reference to FIG. 2, an antiguided semiconductor laser array 30 comprises a plurality of contiguous semiconductor layers 32-36 disposed on a substrate 38, forming a semiconductor body which is a laser heterostructure. For example, substrate 38 may be n—GaAs, a lower cladding layer 36 may be n—$Ga_{1-z}Al_zAs$, a transparent waveguide layer 35 may be n—$Ga_{1-y}Al_yAs$, active region 34 may be a single GaAs layer or multiple layers of GaAs and GaAlAs in a quantum well structure, and upper cladding layer 33 may be p—$Ga_{1-x}Al_xAs$ and a cap layer 32 may be $p^+$—GaAs. Many different variations on the composition of the semiconductor layers are well known.

Electrically conductive contact layers 40 and 41 are disposed on cap layer 32 and substrate 38 for applying an electrical forward bias across the p-n junction proximate to active region 34 and thereby injecting current I into the active region 34 to generate lightwaves. Reflective elements, such as front and rear cleaved facets 42, establish a resonant optical cavity for lengthwise lightwave propagation within the active region 34 waveguide layer 35 under lasing conditions. In FIG. 2, only the front facet 42 is seen (in the plane of the page), the rear facet being on the opposite side of the semiconductor body and parallel to front facet 42. Other cavity defining means, such as external mirrors, or distributed feedback (DFB) and distributed Bragg reflector (DBR) gratings within the semiconductor body are also well known and could be used.

In the laser array 30 shown in FIG. 2, the waveguide layer 35 and adjacent cladding layer 36 vary in thickness in a complementary manner. Waveguide layer 35 is composed of material with a higher refractive index than the material which makes up cladding layer 36, as for example by having a smaller percentage of aluminum than cladding layer 36. Accordingly, the optical field of the lightwaves propagating in active region 34 and waveguide layer 35 experiences a greater effective refraction index in regions 44 where waveguide layer 35 is thickest. The higher effective refractive index regions 44 form a plurality of waveguides or waveguide regions. In between the waveguide regions 44, where the waveguide layer 35 is thinnest and consequently the effective refractive index is lowest, are a plurality of antiguiding regions or antiguides 46 that alternate with the waveguide regions 44. Typically, antiguides 46 have a periodic center-to-center spacing of about four microns, although other spacings are also possible.

Multiple, spaced apart insulative implants 48 may be provided in cap layer 32 to produce a spatial variation in the injected current I from contact 40 through the active region 34 to contact 41. Other means for spatially varying the current I are known and may be used instead or in addition to the implants 48. For example, the contact 40 may be in the form of plural, spaced apart conductive stripes, or reverse bias regions may be formed in cladding layer 33. The spatial variation in current I is arranged so that current through active region 34 is greatest in the antiguide regions 46 between the waveguides 44. Thus, the optical field in antiguide regions 46 experiences greater gain than the optical field in waveguides 44. Additional variation of the gain in favor of antiguide regions 46 is provided by the variation in thickness of the waveguide layer 35 used to define waveguides 44 and antiguides 46. This thickness variation produces a spatial variation in the position of the optical field, such that the intensity profile of the propagating lightwaves is at or near its peak in the active region 34 in antiguide regions 46, but offset so that its peak no longer overlaps the active region 34 in waveguide regions 44. Thus, antiguide regions 44 have a greater filling factor and greater gain. Other techniques could also be used to enhance gain in the antiguides 46 relative to the waveguides 44.

The light emitting elements 50 in antiguide regions 46 proximate to the active region 34 are coupled together by laterally propagating light passing through the high effective index waveguide regions 44 so that a phase locked condition results. The width of waveguide regions 44 in this embodiment is tailored to be a multiple number of lateral half-wavelengths in the waveguide regions so as to enhance resonant transmission between antiguided light elements 50, that is, the width is substantially equal to $m\lambda/2$ where m is a positive integer and $\lambda$ is the wavelength of the laterally propagating lightwaves in the high-index waveguide regions.

In accord with the invention, the laser array 30 in FIG. 2 also has mirror waveguide regions 52 adjacent to the edgemost antiguides 46. Like waveguide regions 44, the mirror waveguide regions 52 are regions of high effective refractive index formed by a thicker waveguide layer 35. However, mirror waveguides 52 have a width that is substantially equal to $(m'+\frac{1}{2})\lambda/2$ so as to minimize resonant transmission into the unpumped side regions 54 of the array and maximize reflection back toward the center of the array.

Figure 1A:
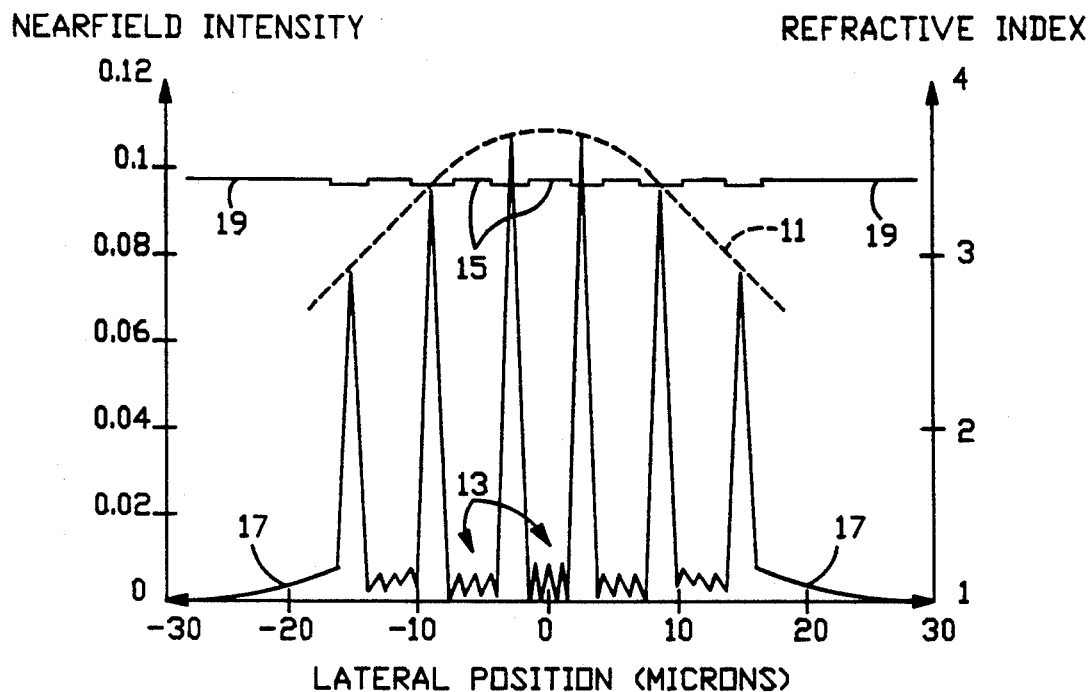
FIGS. 1A and 1B are graphs of near field intensity versus lateral position for respective resonant and nonresonant modes in a six-element antiguide array of the prior art. The effective refractive index versus lateral position for a waveguide layer of such an antiguide array is shown in each graph in phantom as a positional reference.
Figure 1B:
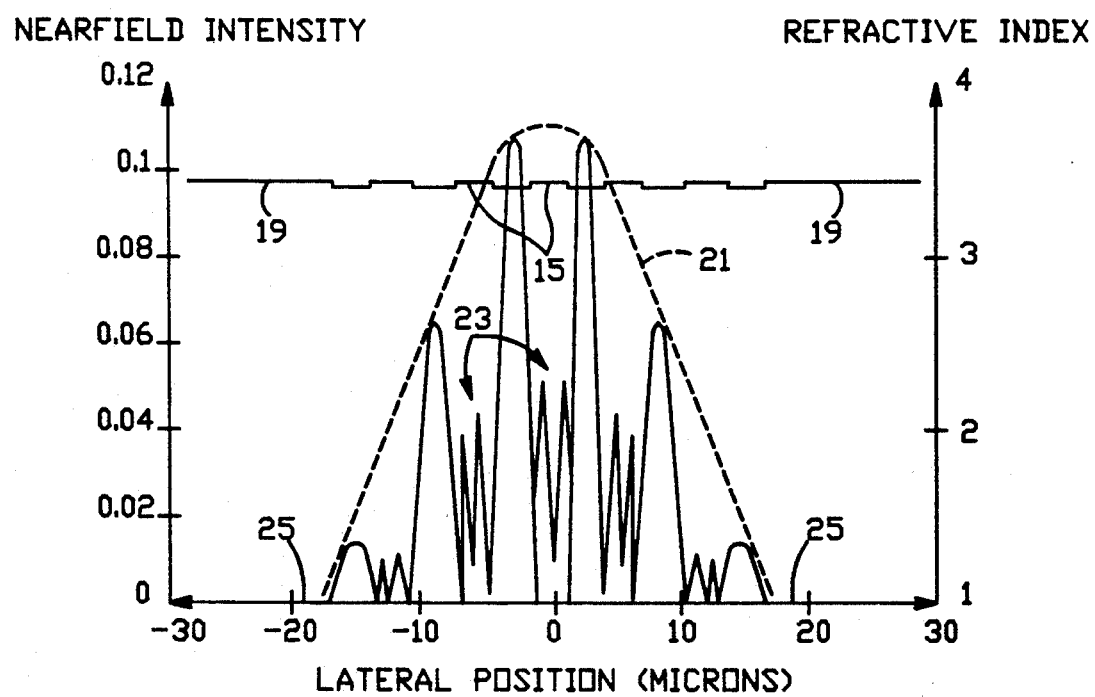
Figure 3A:
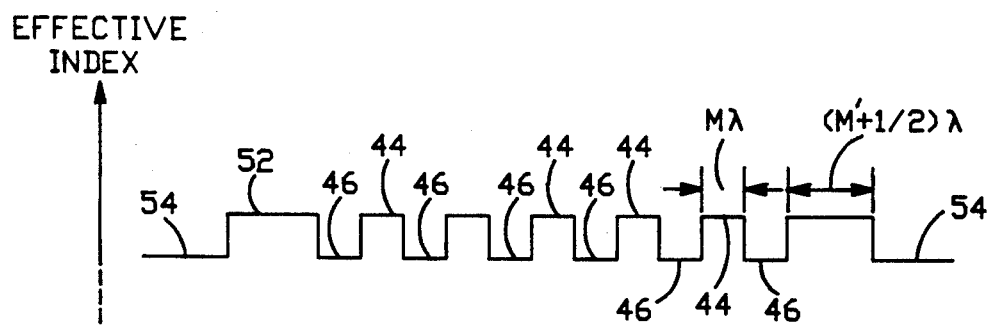
FIGS. 3A and 3B are graphs of respective effective refractive index and emitter gain versus lateral position for the array of FIG. 2.
Figure 3B:
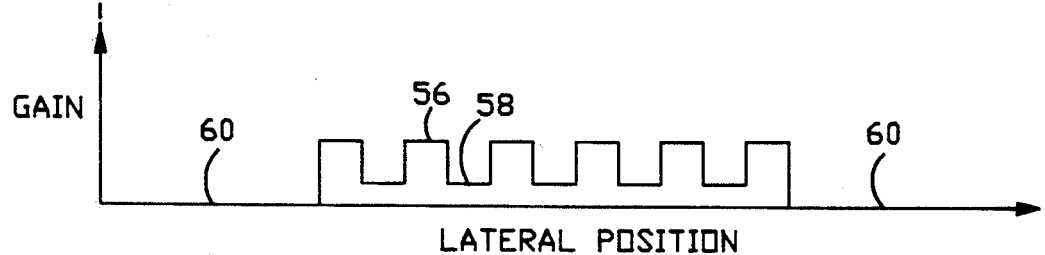
Figure 3C:
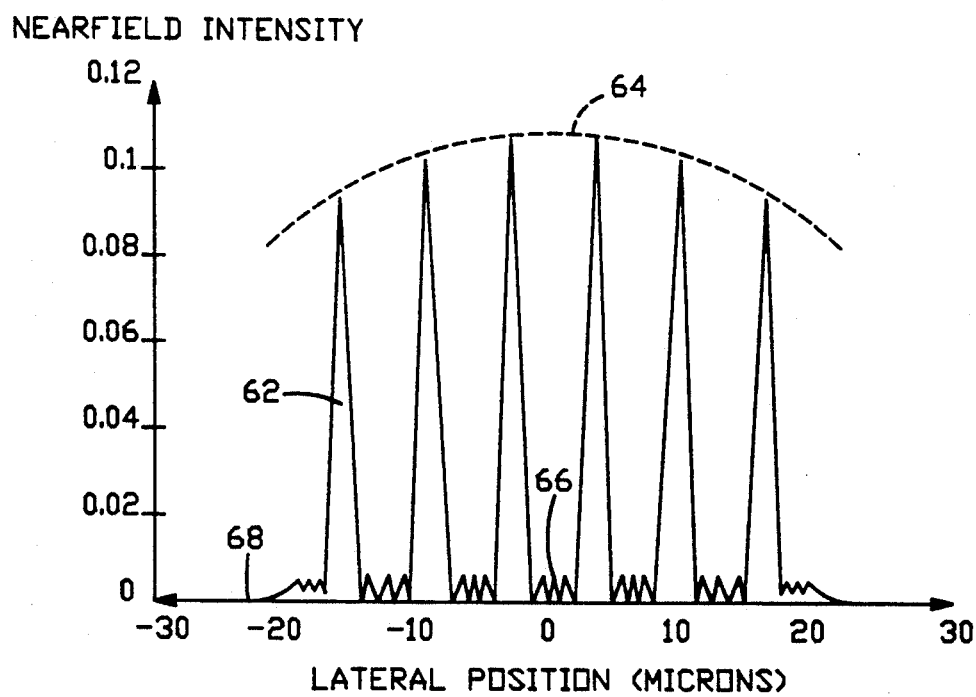
FIG. 3C is a graph of near field intensity versus lateral position for the lowest threshold mode in the array of FIG. 2.

With reference to FIGS. 3A–3C, the effective refractive index of the waveguide layer 35, the gain experienced by the optical field in the waveguide layer and the near field intensity of the emitted light are shown with respect to lateral position in the array. The effective index varies across the array, with the highest effective indices in the waveguide regions 44 and mirror waveguides 52 and with the lowest effective indices in the antiguide regions 46 and unpumped side regions 54. The gain likewise varies across the array, with the highest gain 56 experienced in the regions corresponding to antiguide regions 46 and with the lowest gains 58 experienced in the regions corresponding to waveguide regions 44. The side regions 54 are unpumped so that the corresponding gain 60 should be at or near zero, i.e. below lasing threshold, in those regions 54. The result of the high gains 56 experienced in the antiguides 46 is a set of corresponding intensity peaks 62 for the laser emitters. In the resonant mode, the intensity envelope 64 is nearly uniform over the array of emitters. Also in the resonant mode, the field intensity 66 in the interelement waveguide regions 58 is very low. The resonant mode is enhanced relative to nonresonant modes by the width of the waveguides being substantially equal to a multiple number of half-wavelengths for resonant transmission between emitting elements, but most especially by the mirror waveguide reflectors 52 at the edges of the antiguided array. The tails 17 in FIG. 1A that caused lateral losses for the resonant mode in prior devices have been almost entirely eliminated. The field 68 in the unpumped side regions 54 is very low, since the $(m'+\frac{1}{2})\lambda/2$ width of the mirror waveguides 52 reflects most of the laterally propagating optical energy back toward the center of the array and minimizes transmission into the side regions 54. As a result, losses do not need to be introduced into the waveguides 44 in order to provide good discrimination against the nonresonant modes. Threshold therefore remains low.

Figure 4A:
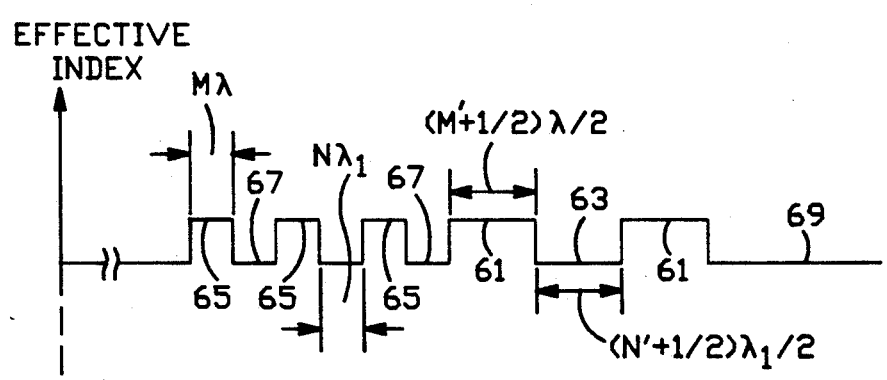
FIGS. 4A and 4B are graphs of respective effective refract index and near field intensity versus lateral position for an antiguide of the present invention having multiple mirror layers.
Figure 4B:
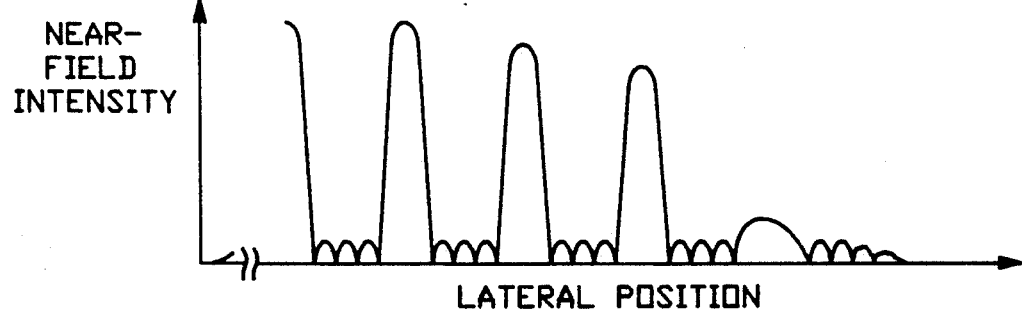

The amount of laterally propagating energy which is reflected by the mirror layers 52 can be increased by adding additional mirror layers on each side of the array so as to form a stack of mirror layers. FIGS. 4A and 4B respectively show the effective refractive index and the corresponding optical nearfield intensity of an antiguide array with a three-layer antiresonant stack on each side. The number of antiresonant layers in the stack can be any positive integer. By including a stack of many antiresonant layers, the field penetration into the unpumped lossy regions 69 at the sides of the array is further reduced over the penetration with one or zero antiresonant mirror layers. Thus, the laser threshold is further reduced, and the modal discrimination is further increased.

The stack of antiresonant layers is composed of alternating high refractive index and low refractive index regions 61 and 63. If in the body of the array the widths of the high-index and low-index regions 65 and 67 are chosen to be $m\lambda/2$ and $N\lambda_1/2$, respectively, where "m" and "n" are integers and $\lambda$ and $\lambda_1$ are the lateral wavelengths in the high-index and low-index regions 65 and 67, respectively, then the widths of the antiresonant layers 61 and 63 are $(m'+\frac{1}{2})\lambda/2$ and $(n'+\frac{1}{2})\lambda/2$, where "m'" and "n'" are integers, not necessarily equal to m and n.

Figure 5:
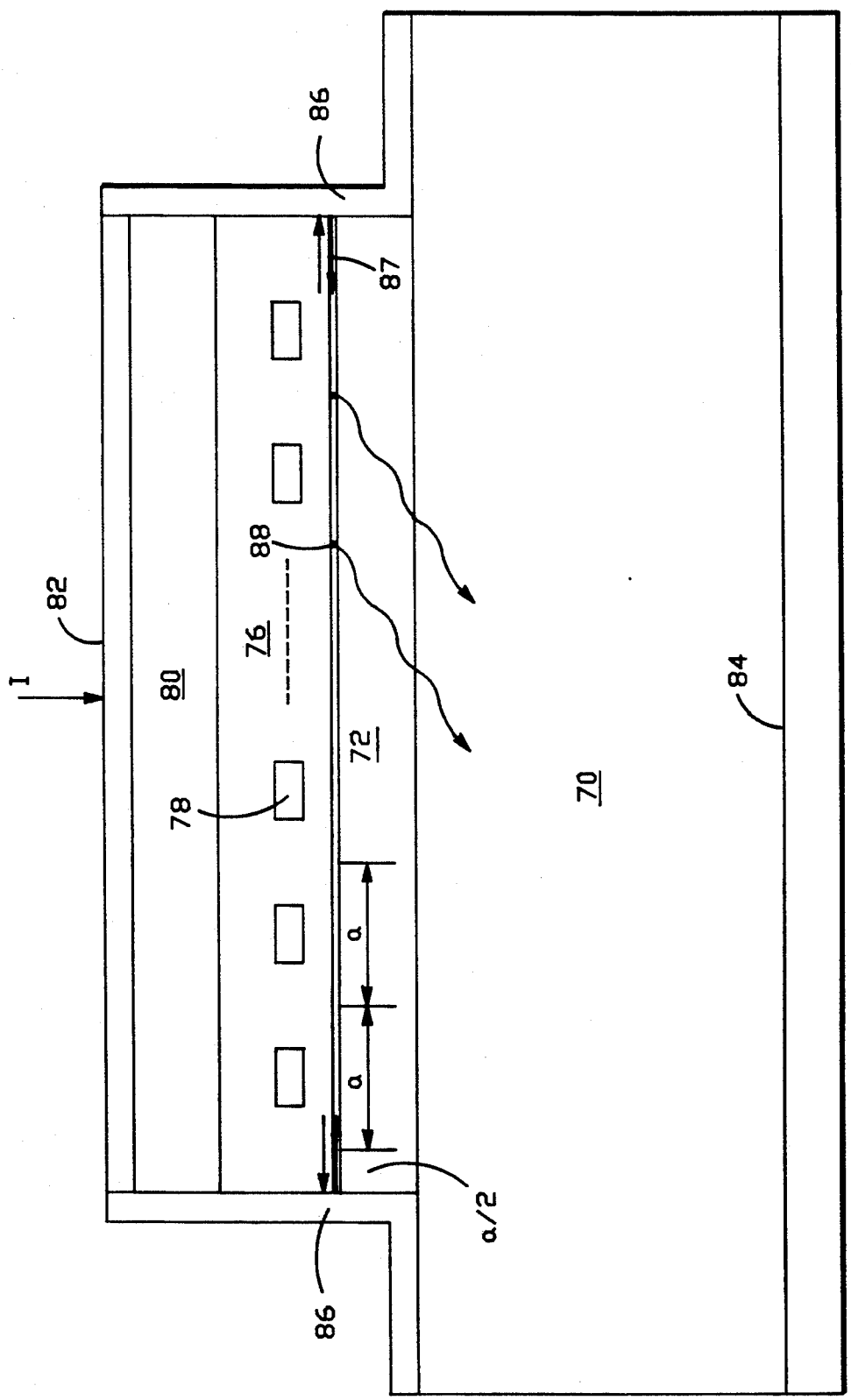
FIGS. 5 and 6 are front end views of respective second and third antiguide array embodiments in accord with the present invention.
Figure 6:
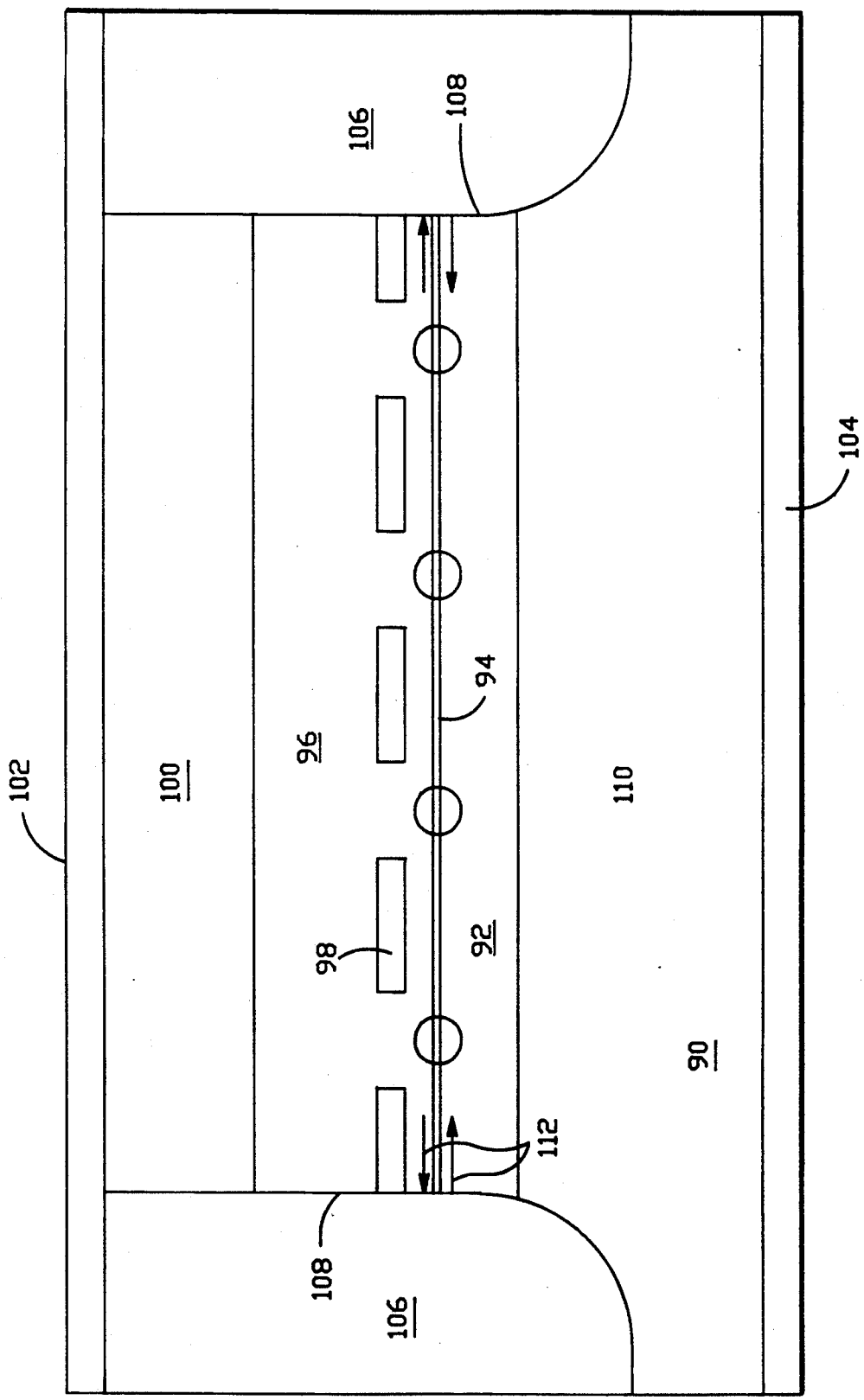

With reference to FIGS. 5 and 6, two other laser array embodiments in accord with the present invention also provide structures, in this case mirrors, at the sides of the array of laser emitters next to the edgemost waveguides and not spaced on the array period for reflecting back a portion of the laterally transmitted radiation of the laser array toward the center of the array. As in the first embodiment, described above, the lasers are made of a plurality of contiguous semiconductor layers disposed on a substrate to form a semiconductor body that is a laser heterostructure. In particular, the heterostructure may include a substrate 70 or 90, lower cladding layer 72 or 92, an active region 74 or 94 of at least one layer, an upper cladding layer 76 or 96, a plurality of laterally spaced apart waveguide layers 78 or 98 within the upper cladding layer 76 or 96 and having a higher refractive index than the upper cladding layer, and a cap layer 80 or 100. The compositions of these layers may be the same as those for corresponding layers in the first array embodiment in FIG. 2. Electrical conductive contact layers 82 or 102 and 84 or 104 inject current I into the active region 74 or 94 to produce lightwaves. A resonant optical cavity for longitudinally propagating light array may be defined by a pair of cleaved end facets, one of which is the surface seen to be in the plane of page in FIGS. 5 and 6, the other being on the parallel, opposite surface. Other cavity defining feedback arrangements could also be used.

The optical field generated by the active region 74 or 94 experiences greater gain in regions between the waveguides 78 than in the waveguide regions 78 themselves. This can be arranged in a number of different ways, such as by any of the current or optical field spatial modulation producing structures given above for the embodiment in FIG. 2. In FIGS. 5 and 6, the particular spatial modulation structure shown happens to be a lateral spatial modulation in the thickness of the waveguide layer 78 or 98 between some finite value (waveguide present) and zero (waveguide absent). As with the thickness modulation situation in FIG. 2, the waveguides 78 or 98 cause the optical field to be offset from the active region 74 or 94 so that the peak intensity no longer lies in the active region, while areas between the waveguides 78 or 98 have the peak intensity of the optical field very close to or within the active region 74 or 94. Accordingly, the filling factor of the optical field is spatially modulated and the regions between the waveguides 78 or 98, that is, "antiguide" regions, experience the greatest gain. This is depicted by the array of laser emitters 88 or 110 in the antiguide regions.

The laser emitters 88 or 110 are optically coupled together in a phase locked condition by lateral light propagation across the waveguide regions 78 or 98. In these embodiments, the width of the waveguides 78 or 98 are selected to favor the resonant mode. In other words, the width of the waveguides 78 or 98 is selected to approximately equal $m\lambda/2$, where m is an integer and $\lambda$ is the wavelength of laterally propagating light in the waveguide region. In order to provide a uniform near field intensity, mirrors 86 or 108 are provided at the edges of the laser array. Mirrors 86 and 108 redirect the laterally propagating light 87 or 112 back toward the center of the array. It is discovered that when the reflective surface of the mirror is spaced approximately a/2 from the center of the edgemost emitter, where a is the center-to-center emitter spacing, for example, a distance of about 4 μm, then the array behaves as though there were an infinite emitter array, creating a uniform near field intensity envelope in the process. Other spacings also provide a more uniform near field than the field where no mirror is present at all, but the uniformity is not nearly as great as when the spacing is approximately a/2 from the edgemost emitters.

The mirrors 86 or 108 may be created in any of several different ways. In FIG. 5, mirrors 86 comprise etched side faces in the semiconductor body at the edges of the array, which may then be coated with a dielectric material, such as $Si_3N_4$. The index step between the semiconductor body and the dielectric coating may be selected for total internal reflection of the non-resonant mode. Such antiguided light has a lateral propagation angle of about 6°, and so intercepts the mirror surface at that angle. The dielectric coating may also have a thickness of about one-quarter wavelengths to enhance reflection of the laterally propagating light. Multiple coatings could also be used. In FIG. 6, the mirrors 108 are created by impurity induced disordering of the side regions 106 of the array. Disordering produces a refractive index step at the boundary 108, where reflection of light 112 can take place. Again, the index step is preferably chosen to reflect the light of the resonant mode incident at about 6° with the reflective boundary 108.

We claim:

1. A semiconductor laser array structure comprising a semiconductor body having an active light emitting region with an array of periodically spaced apart antiguiding elements separated by regions of higher effective refractive index than said antiguiding elements, and
means in said body at edges of said array for reflecting back a portion of light laterally transmitted across the array.

2. The laser array of claim 1 wherein said antiguiding elements are periodically spaced apart in said array, said reflecting means being effectively spaced from said array edges at a distance other than the periodic spacing of said antiguiding elements.

3. The laser array of claim 1 wherein said reflecting means comprises at least two side regions of higher effective refractive index than said antiguiding elements located adjacent to the edgemost antiguiding elements of said array, said side regions having widths approximately equal to $(m'+\frac{1}{2})/2$ wavelengths of light propagating laterally across said array, where "m'" is either zero or a positive integer, the others of said higher effective refractive index regions having widths substantially equal to $m/2$ wavelengths of said light propagating laterally across said array for enhancing resonant transmission of said light, where "m" is a positive integer.

4. The laser array of claim 3 further comprising additional side regions of alternating equal refractive index and higher refractive index than said antiguiding elements added to the sides of the array, said higher refractive index regions having a width approximately equal to $(m'+\frac{1}{2})/2$ wavelengths and said equal refractive index regions having a width approximately equal to $(n'+\frac{1}{2})/2$ wavelengths of laterally propagating light in said regions, were "n'" is either zero or a positive integer.

5. The laser array of claim 1 wherein said reflecting means comprises two side mirrors spaced by a distance of substantially (a/2) from the edgemost antiguiding elements of said array, where "a" is the periodic spacing between said antiguiding elements.

6. The laser array of claim 5 wherein said side mirrors comprise refractive index boundary surface in said semiconductor body.

7. A semiconductor laser array comprising
a plurality of semiconductor layers disposed over a substrate, at least one of said layers forming an active region for lightwave generation and propagation under lasing conditions,
feedback means for establishing a resonant cavity for lengthwise propagating lightwaves,
means for applying an electrical forward bias across and injecting current into said active region to produce said lightwaves,
waveguide means associated with said active region for guiding said lightwaves and providing an array of spaced apart laser emitters, the optical field of said laser emitters experiencing greater gain in regions between said waveguide means than within said waveguide means, said laser emitters being optically coupled by laterally propagating lightwaves across said waveguide means into adjacent laser emitters to provide a phase locked condition across said array, and
edge reflector means formed in said plurality of semiconductor layers at edges of said array of laser emitters for reflecting back at least a portion of said laterally propagating lightwaves toward a center of said array.

8. The laser array of claim 7 wherein said laser emitters are periodically spaced apart in said array, said edge reflector means spaced at a distance from edgemost laser emitters in said array other than the periodic spacing between said laser emitters.

9. The laser array of claim 7 wherein said edge reflecting means comprises at least a pair of edge waveguides adjacent to said edgemost emitters, said edge waveguides having a width substantially equal to $(m'+\frac{1}{2})/2$ wavelengths of the laterally propagating light, where "m'" is either zero or a positive integer, the plurality of waveguides other than said edge waveguides having a width substantially equal to $m/2$ wavelengths of the laterally propagating light, where "m" is an integer.

10. The laser array of claim 9 wherein said edge reflecting means comprises a pair of stacks of edge waveguides adjacent to said edgemost emitters, said edge waveguides having a width substantially equal to $(m'+\frac{1}{2})\lambda/2$, regions between said edge waveguides having a width substantially equal to $(n'+\frac{1}{2})\lambda_1/2$, where "m'" and "n'" are each either zero or a positive integer and where $\lambda$ and $\lambda_1$ are wavelengths of the laterally propagating light through said edge waveguides and said between regions, respectively.

11. The laser array of claim 7 wherein said reflecting means comprises two side mirrors spaced by a distance substantially "a/2" from the edgemost antiguiding elements of said array, where a is the periodic spacing between said antiguiding elements.

12. The laser array of claim 11 wherein said side mirrors comprise refractive index boundary surfaces in said semiconductor body.

13. A laser array comprising
an array of laser emitters located within a resonant cavity between a plurality of waveguides, said emitters being substantially identical and equally spaced apart by a distance "a", and
edge reflector means alongside said array for feedback of laterally propagating light into said edgemost emitters, said edge reflector means being laterally spaced from said edgemost emitters by substantially a distance "a/2".

14. The laser array of claim 13 wherein said edge reflecting means comprises a pair of edge waveguides adjacent to said edgemost emitters, said edge waveguides having a width substantially equal to $(m'+\frac{1}{2})/2$ wavelengths of the laterally propagating light, where m is an integer, the plurality of waveguides other than said edge waveguides having a width substantially equal to $m/2$ wavelengths of the laterally propagating light, where "m" is a positive integer.

15. The laser array of claim 14 wherein said edge reflecting means comprises a pair of stacks of edge waveguides adjacent to said edgemost emitters, said edge waveguides having a width substantially equal to $(m'+\frac{1}{2})\lambda/2$, regions between said edge waveguides having a width substantially equal to $(n'+\frac{1}{2})\lambda_1/2$, where "m'" and "n'" are each either zero or a positive integer and where $\lambda$ and $\lambda_1$ are wavelengths of the laterally propagating light through said edge waveguides and said between regions, respectively.

16. The laser array of claim 13 wherein said edge reflector means comprises two side mirrors spaced a distance a/2 from said edgemost emitters.

17. The laser array of claim 16 wherein said side mirrors comprise boundary surfaces where a refractive index change occurs relative to a refractive index in regions of said laser emitters.

* * * * *